United States Patent

Higashi

[11] Patent Number: 5,937,120
[45] Date of Patent: Aug. 10, 1999

[54] OPTICAL DEVICE

[75] Inventor: Toshio Higashi, Kanagawa, Japan

[73] Assignee: Fujitsu Limited, Kawasaki, Japan

[21] Appl. No.: 08/978,272

[22] Filed: Nov. 25, 1997

[30] Foreign Application Priority Data

Feb. 7, 1997 [JP] Japan ................................. 9-024939

[51] Int. Cl.⁶ ..................................................... G02B 6/30
[52] U.S. Cl. ................................ 385/49; 372/32; 372/102
[58] Field of Search ................................ 385/43, 44, 49, 385/33, 47, 88; 372/20, 32, 92, 96, 102, 7, 19, 43; 359/152, 173; 438/27, 33

[56] References Cited

U.S. PATENT DOCUMENTS

| 4,611,884 | 9/1986 | Roberts ................................ 385/43 |
| 5,717,711 | 2/1998 | Doussiere et al. ................... 372/102 |
| 5,870,417 | 2/1999 | Verdiell et al. ....................... 372/32 |

FOREIGN PATENT DOCUMENTS 7-283490  10/1995  Japan .

OTHER PUBLICATIONS

T. Tanaka et al., Electronics Letters, vol. 32, No. 13, pp. 1202–1203, Jun. 20, 1996.

A. Hamakawa et al., First Optoelectronics and Communication Conference (OECC 96) Technical Digest, pp. 456–457, Jul. 1996.

*Primary Examiner*—Akm E. Ullah
*Attorney, Agent, or Firm*—Armstrong, Westerman, Hattori, McLeland & Naughton

[57] ABSTRACT

An optical device comprises a light emitting device for emitting a light beam whose radiation angle is less than 15 degree and having a light emitting end surface on which a antireflection layer is formed, an optical fiber having a flat light incident end surface on which a antireflection layer is formed and a diffraction grating formed therein, and a substrate for supporting the light emitting device and the optical fiber so as to oppose the antireflection layer of the light emitting device to the antireflection layer of the optical fiber.

8 Claims, 3 Drawing Sheets

OPTICAL DEVICE

BACKGROUND OF THE INVENTION

1. Field of the Invention

The present invention relates to an optical device and, more particularly, an optical device in which an optical semiconductor device and an optical fiber having diffraction gratings are optically coupled to each other.

2. Description of the Prior Art

A semiconductor laser has been applied to an optical sensor. For the purposes of example, such an optical sensor can be enumerated that, by taking account of the fact that a light having a single wavelength can be emitted from the semiconductor laser, it can measure various change in physical quantities of external environment of the semiconductor laser based on change in phase of the light having the single wavelength.

Accordingly, it is required of the semiconductor laser serving as a light source in the optical sensor to output an extremely pure monochromatic light, i.e., to reduce fluctuation of the wavelength of the oscillation light.

As one of methods of reducing fluctuation of the wavelength of the oscillation light emitted from the semiconductor laser, it has been requested that, by providing wavelength dependence to a threshold value in laser oscillation, laser oscillation can be generated selectively in a particular mode while a gain cannot reach the threshold value in other modes.

As one of the methods, for example, there has been a device in which reflectors are provided to the outside of a Fabry-Perot semiconductor laser. According to this device, the laser oscillation easily occurs on the wavelength at which phase of the reflected light from the reflectors coincide with phase of the light generated in the semiconductor laser, so that the light having the single wavelength can be emitted from the semiconductor laser.

In addition, such a device has also been known that has a diffraction grating constituting a resonator to oscillate the light having the single wavelength. As such semiconductor laser with the diffraction grating, there have been well known a distributed feedback semiconductor laser and a distributed-Bragg reflector semiconductor laser. In both the distributed feedback semiconductor laser and the distributed-Bragg reflector semiconductor laser, the diffraction grating is formed in the semiconductor substrate constituting the semiconductor laser.

As still another optical devices with the diffraction grating, for instance, devices in which the diffraction grating is provided to the outside of the semiconductor laser have been set forth in Tanaka et al., ELECTRONICS LETTERS Jun. 20, 1996, Vol.32, No.13; Atsushi Hamakawa et al., First Optoelectronics and Communications (OECC '96) Technical Digest, July 1996, Makuhari Messe; etc.

In Tanaka et al., a structure has been disclosed wherein a semiconductor laser (laser diode) is mounted on the silicon substrate and a waveguide with the diffraction grating is formed on a surface of the silicon substrate. In this structure, it is difficult to form antireflection layers on end surfaces of the waveguide formed on the silicon substrate, so that the light is difficult to be maintained on the single wavelength. In addition, even if the antireflection layers can be formed on the end surfaces of the waveguide, this structure becomes complicated since an optical fiber must be coupled to the end portions of the waveguide.

In contrast, as shown in FIG. 6, the device set forth in Hamakawa et al. has a structure wherein an optical fiber 101 in which a diffraction grating 102 is formed is optically coupled to an output end of a semiconductor laser 103.

In this device, wavelength selectivity can be increased by the diffraction grating 102 provided in the optical fiber 101. Furthermore, in order to improve an optical coupling efficiency between the semiconductor laser 103 and the optical fiber 101, an top end of the optical fiber 101 is worked to form a lens 104.

However, in the device set forth in Hamakawa et al., as curvature of a spherical surface of the lens 104 provided on the top end of the optical fiber 101 becomes smaller, it becomes more difficult to coat the antireflection layer on the spherical surface of the lens 104.

Unless the antireflection layer is coated, unnecessary resonator modes appear since the lights are reflected from the spherical surface of the lens 104 of the optical fiber 101 to therefore return to the semiconductor laser 103. As a result, degradation in the single wavelength characteristic of the device is brought about.

SUMMARY OF THE INVENTION

It is an object of the present invention to provide an optical device which is able to achieve good optical coupling efficiency and also emit a light with a single wavelength.

According to the present invention, the light emitting device whose light beam radiation angle is less than 15° is employed and also the end surface of the optical fiber having the diffraction grating is made flat so as to form the antireflection layer thereon.

Hence, when the light emitting device is optically coupled to the optical fiber, it can be omitted to form the lens on the light incident end surface of the optical fiber. Therefore, the top end of the optical fiber can be made flat and thus the antireflection layer can be formed securely on the flat top end of the optical fiber.

As a result, the resonator is hard to be formed between the light incident end surface of the optical fiber and the reflection end of the light emitting device, but the substantial resonator can be formed only between the diffraction grating of the optical fiber and the reflection end of the light emitting device. For this reason, the light can be emitted from the diffraction grating into the optical fiber in a stable single mode without unnecessary modes.

In addition, if the multilayered structure made of the low refractive index film and the high refractive index film is employed as the film formed on the end surface of the light emitting device through which the light is not emitted, high light reflectivity can be achieved.

Still further, if the groove is formed on the supporting substrate and then the optical fiber is fitted into the groove, positioning of the optical fiber to the supporting substrate can be made easy.

If the temperature of the optical fiber is adjusted by the temperature control means, phase of the light proceeding in the optical fiber from the diffraction grating to the inner area of the optical fiber can be changed.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENTS

Figure 1:
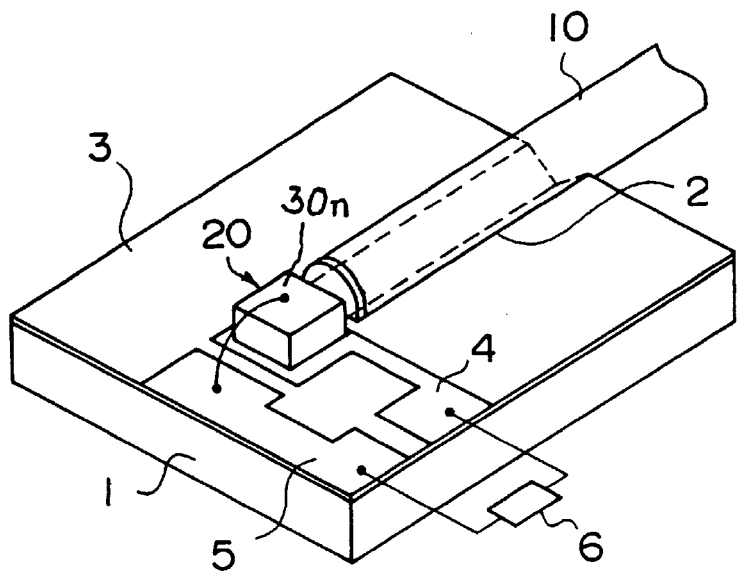
FIG. 1 is a perspective view showing an optical device according to an embodiment of the present invention.

Various embodiments of the present invention will be described with reference to the accompanying drawings. It should be noted that the same or similar reference numerals are applied to the same or similar parts and elements throughout the drawings, and the description of the same or similar parts and elements will be omitted or simplified.

Figure 2:
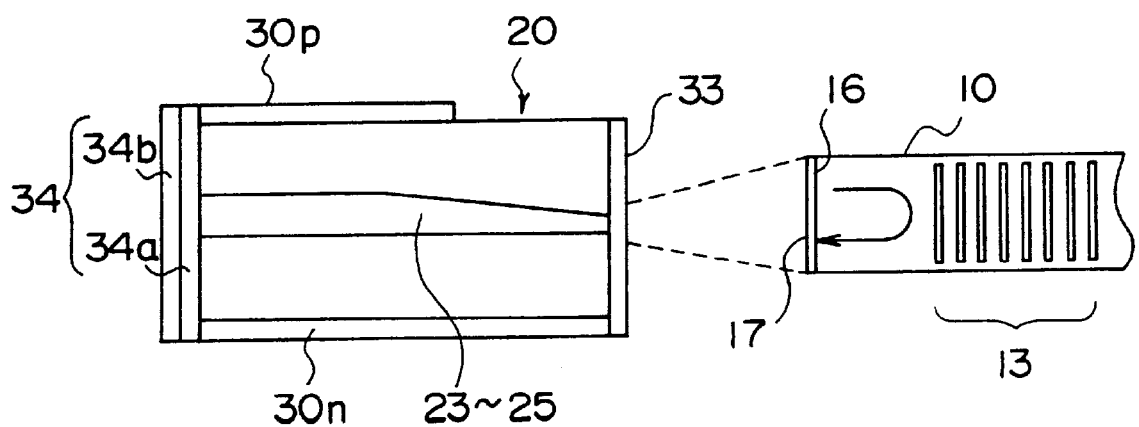
FIG. 2 is a sectional view showing an arrangement of a light emitting device and an optical fiber in the optical device according to the embodiment of the present invention.

FIG. 1 is a perspective view showing an optical device according to an embodiment of the present invention. FIG. 2 is a sectional view showing an optical coupling between a light emitting device and an optical fiber in the optical device according to the embodiment of the present invention.

In FIGS. 1 and 2, a V-shaped groove 2 is formed on a silicon substrate 1 to fit an optical fiber 10 therein. A silicon oxide film 3 is formed uniformly on an upper surface of the silicon substrate 1 and a surface of the V-shaped groove 2.

In addition, on the silicon oxide film 3 formed on the surface of the silicon substrate 1, a first leading wiring pattern 4 is formed to intersect with a prolonged center line of the V-shaped groove 2 along its longitudinal direction and a second leading wiring pattern 5 is formed adjacent to the first leading wiring pattern 4 in parallel therewith.

Further, a semiconductor laser (light emitting device) 20 having a tapered-waveguide is secured to a surface of the first leading wiring pattern 4. An output end surface of the semiconductor laser 20 is arranged to face to an end surface of the optical fiber 10 provided on the V-shaped groove 2 at a distance of 10 to 100 $\mu$m. Thus the semiconductor laser 20 can be optically coupled to the optical fiber 10. As described later, the tapered-waveguide has such a structure that its core portion is made gradually thinner from one end to the other end.

Figure 3:
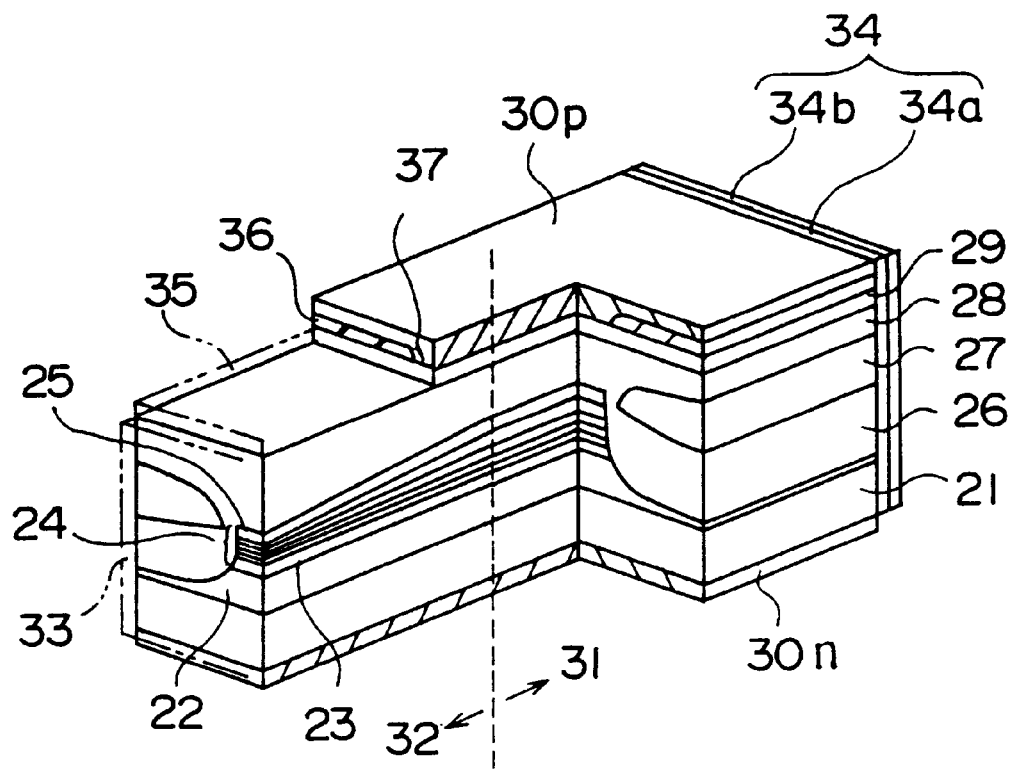
FIG. 3 is a perspective view showing, partially in section, an example of the light emitting device for use in the optical device according to the embodiment of the present invention.

The semiconductor laser 20 has a Fabry-Perot type structure having a peak oscillation wavelength at a 1.3 $\mu$m band, as shown in FIG. 3, for example, and has a gain region 31 and a mode conversion waveguide region 32.

In FIG. 3, an n-InP cladding layer 22, a first guide layer 23 made of InGaAsP, MQW layers 24, a second guide layer 25 made of InGaAsP, and a p-InP cladding layer 28 are formed on an n-InP substrate 21. The MQW layers 24 consist of a plurality of well layers made of InGaAsP and a plurality of barrier layers made of InGaAsP and formed between the well layers. Composition of these InGaAsP is selected such that bandgaps between the well layers are made smaller than those between the barrier layers. The MQW layers 24 and the second guide layer 25 are changed in thickness along the optical waveguide direction in the mode conversion waveguide region 32 so as to form a taper shape which has a thickest thickness on a boundary between the gain region 31 and the mode conversion waveguide region 32 and a thinnest thickness on the optical output end side. The MQW layers 24 and the second guide layer 25 have the refractive index higher than the cladding layers 22, 28 and constitute the core layer of the waveguide in the mode conversion waveguide region 32.

Planar shapes of respective layers from the n-InP cladding layer 22 to the p-InP cladding layer 28 are formed like a stripe shape. The p-InP buried layer 26 and the n-InP buried layer 27 are formed on both ends of these layers. In addition, a p-InP cladding layer 28 is formed on the p-InP cladding layer 28 and the n-InP buried layer 27 again.

A contact layer 29 made of p$^+$-InGaAsP is formed on the p-InP cladding layer 28 in a part of the gain region 31 and the mode conversion waveguide region 32 continuously. Furthermore, a p-side electrode 30p is formed on the contact layer 29 in at least the gain region 31. The p-side electrode 30p is brought into contact with the first leading wiring pattern 4 when the semiconductor laser 20 is secured to the surface of the first leading wiring pattern 4. An n-side electrode 30n is formed beneath the n-InP substrate 21. The n-side electrode 30n is connected to the second leading wiring pattern 5 formed on the silicon substrate 1 in terms of wire bonding.

The reason of opposing the p-side electrode to the silicon substrate 1 is because the thickness control if the compound semiconductor growing on the InP substrate is more easy than that of the InP substrate. Therefore, it is easy to adjust the end of MQW layer 24 and the end of the optical fiber 10.

A antireflection layer 33, which is made of silicon nitride of 0.17 $\mu$m thickness and has optical transmittance of 99%, is formed on the end surface of the semiconductor laser 20 having the above structure on the mode conversion waveguide region side. A reflection film 34, which is formed as a multilayered structure consisting of a low refractive index layer 34a and a high refractive index layer 34b being formed in sequence on the end surface, is formed on the end surface of the semiconductor laser 20 in the gain region 31. For example, the low refractive index layer 34a is made of SiO$_2$ and the high refractive index layer 34b is made of Si.

In FIG. 1, a reference 6 denotes a current source connected between the first and second leading wiring patterns 4 and 5. In FIG. 3, a reference 35 denotes a protection film which is made of SiO$_2$ to cover the p-InP cladding layer 28 in the mode conversion waveguide region 32, and a reference 36 denotes a current limiting insulating layer which is made of SiO$_2$ formed between the contact layer 29 and the p-side electrode 30p to have an opening 37.

Figure 4:
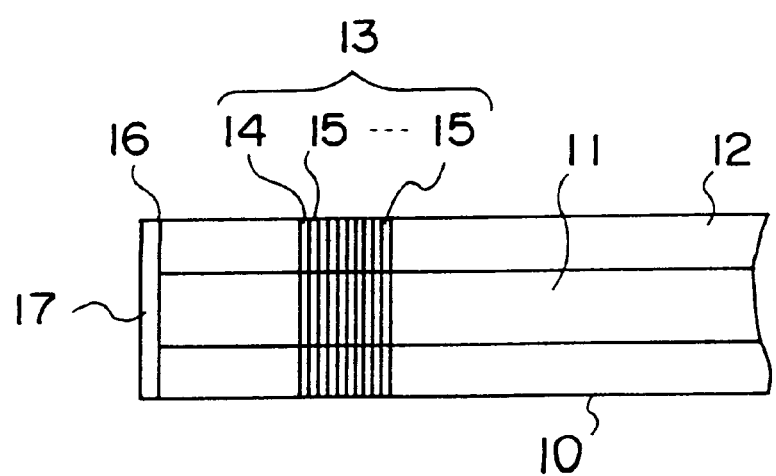
FIG. 4 is a sectional view showing an example of the optical fiber for use in the optical device according to the embodiment of the present invention.

The optical fiber 10 which being optically coupled to the semiconductor laser 20 has a structure as illustrated in FIG. 4, for instance.

In FIG. 4, the optical fiber 10 comprises a core layer 11 made of Ge-annexed glass of 10 $\mu$m diameter and a cladding layer 12 made of glass of 125 $\mu$m diameter. The refractive index of the cladding layer 12 is set smaller than the core layer 11. The cladding layer 12 is formed to surround the core layer 11. A diffraction grating 13 is formed near the light incident end surface 16 of the optical fiber 10 which is positioned on the V-groove 2 of the silicon substrate 1. The diffraction grating 13 is made up of at least one set of first layers 14 with low refractive index and second layers 15 with high refractive index which are alternatively formed in this order from the near side of the semiconductor laser 20 to the far side thereof. Respective thicknesses of the first layer 14 and the second layer 15 are set to $\lambda/4$. Where $\lambda$ is a wavelength in the fiber of the laser light oscillated from the semiconductor laser 20.

The light incident end surface 16 of the optical fiber 10 opposing to the semiconductor laser 20 is cleft substantially flat. A antireflection layer 17, which is made of SiN of $\lambda/4$ thickness and has optical transmittance of 99%, for example, is formed on the light incident end surface 16.

With the above structure, the semiconductor laser 20 and the optical fiber 10 can be optically coupled on the silicon substrate 1 to enable current flow between the p-side electrode 30p and the n-side electrode 30n of the semiconductor laser 20. Accordingly, the laser light being oscillated in the gain region 31 of the semiconductor laser 20 can be confined in the MQW layers 24 and the first and second guide layers 22, 25 in the gain region 31. Then, an optical spot diameter of the laser light is increased in the mode conversion waveguide region 32 since a light confinement effect becomes smaller as the laser light advances towards the top end of the MQW layers 24 in the tapered-structure. Then, the laser light whose diameter has been increased can be emitted from the antireflection layer 33.

In the semiconductor laser 20, for example, the laser light whose diameter has been increased in the mode conversion waveguide region 32 can be emitted via the antireflection layer 13 at a beam radiation angle which is smaller than 15° or less, for example. As a result, there is no necessity of a light focusing lens to couple the semiconductor laser 20 to the optical fiber 10. Since the current hardly flows in the mode conversion waveguide region 32, the light is never amplified. In addition, the well layers of the MQW layers 24 are made thinner to expand substantially energy bands in the mode conversion waveguide region 32 as the location becomes closer to the light output end, and therefore light absorption is difficult to occur in the mode conversion waveguide region 32.

The laser light emitted from the semiconductor laser 20 enters into the light incident end surface 16 of the optical fiber 10 to irradiate the diffraction grating 13. Because the diffraction grating 13 may function as a Bragg reflection mirror in the optical fiber 10, a substantial resonator for the light oscillated in the semiconductor laser 20 is formed between the reflection film 34 of the semiconductor laser 20 and the diffraction grating 13 of the optical fiber 10. A length of the resonator is, e.g., 2 to 200 mm.

When an output of the light oscillated between the reflection film 34 of the semiconductor laser 20 and the diffraction grating 13 of the optical fiber 10 exceeds the threshold value, the light may proceed through the core layer 11 from the diffraction grating 13 to the other end surface (not shown) of the optical fiber 10. At this time, the wavelength of the light which proceeds through the core layer 11 to the other end surface would be fixed to a certain value which is selected according to a Bragg frequency of the diffraction grating 13 in oscillation wavelength modes of the semiconductor laser 20.

According to the above structure, since the resonator is formed between the reflection film 34 provided on the rear end of the semiconductor laser 20 and the diffraction grating 13 positioned outside of the reflection film 34, the length of the resonator can be prolonged to thus render fluctuation of the oscillation wavelength small. In addition, since the light incident end surface 16 of the optical fiber 10 opposing to the semiconductor laser 20 is made flat, the antireflection layer 17 can be readily formed on the light incident end surface 16.

As a result, resonator modes are difficult to appear between the reflection film 34 provided on the rear end of the semiconductor laser 20 and the light incident end surface 16 of the optical fiber 10 and therefore degradation in the single mode of the oscillated light can be suppressed.

A coupling efficiency between the semiconductor laser 20 and the optical fiber 10 is more than −3 dB.

Figure 5:
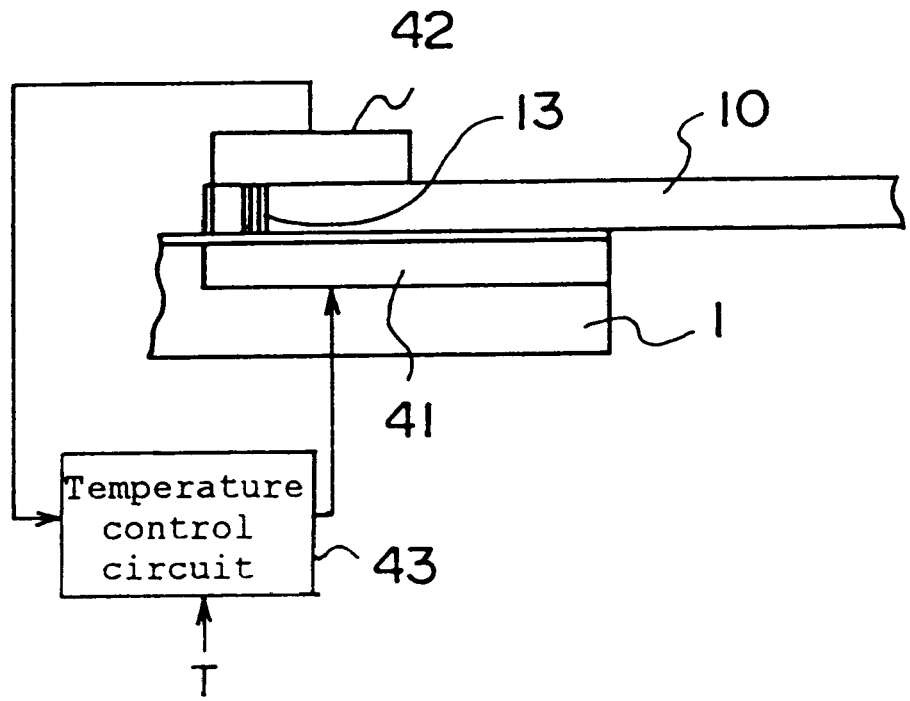
FIG. 5 is a schematic side view showing the optical fiber, to which a temperature control means is provided, for use in the optical device according to the embodiment of the present invention.
Figure 6:
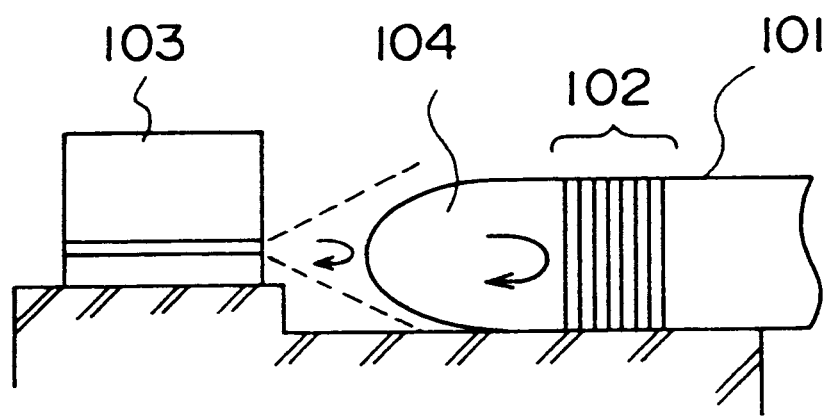
FIG. 6 is a side view showing an example of an optical device in the prior art.

In any event, a structure shown in FIG. 5 is employed in order to change phase of the light generated by the resonator which is formed between the reflection film 34 provided on the rear end of the semiconductor laser 20 and the diffraction grating 13. In other words, a temperature adjusting device 41 such as Peltier device and a temperature detector 42 such as thermistor are connected to a portion of the optical fiber 10 extending from the light incident end surface 16 to the diffraction grating 13, and then a temperature of the temperature adjusting device 41 is controlled by a temperature control circuit 43. In this case, if a desired temperature T is set in the temperature control circuit 43 and then a temperature detected by the temperature detector 42 is different from the desired temperature T, the optical fiber 10 can be heated or cooled by the temperature adjusting device 41 to be kept at the desired temperature T.

The well layers of the MQW layers 24 of the semiconductor laser 20 or the cladding layers 22, 26 are not limited to the above-mentioned material. For example, the well layers may be formed of InGaAsP or AlGaInAs and the cladding layers may be formed of InP, otherwise the well layers may be formed GaAs and the cladding layers may be formed of AlGaAs. Alternatively, the well layers may be formed of GaInP and the cladding layers may be formed of AlGaInP. Furthermore, the MQW layers may be formed GaInNAs or AlGaInAs if a GaAs substrate is employed, and then the well layers and the barrier layers may be individually composed by changing its composition ratio of the material.

As discussed above, according to the optical device of the present invention, the light emitting device having a light beam radiation angle of less than 15° is employed and also the end surface of the optical fiber having the diffraction grating is made flat to form the antireflection layer thereon. Hence, formation of the lens on the light incident end surface of the optical fiber is not needed when the light emitting device is optically coupled to the optical fiber. As a result, the antireflection layer can be formed securely on the top end of the optical fiber.

Therefore, no resonator is formed between the light incident end surface of the optical fiber and the reflection end of the light emitting device, nevertheless the resonator can be formed only between the diffraction grating of the optical fiber and the reflection end of the light emitting device. For this reason, the light having a stable single mode without unnecessary modes can be transmitted from the diffraction grating to the optical fiber.

In addition, if the multilayered structure made of the low refractive index film and the high refractive index film is employed as the film formed on the end surface of the light emitting device through which the light is not emitted, high light reflectivity can be achieved. Still further, if the groove is formed on the supporting substrate and then the optical fiber is fitted into the groove, the optical fiber can be positioned easily to the supporting substrate. If the temperature of the optical fiber is adjusted by the temperature control means, the light which proceeds in the optical fiber from the diffraction grating to the inner area of the optical fiber can be adjusted in phase.

Various modifications will become possible for those skilled in the art after receiving the teachings of the present disclosure without departing from the scope thereof.

What is claimed is:

1. An optical device comprising:

a light emitting device for emitting a light beam whose radiation angle is less than 15 degree and having a light emitting end surface on which an antireflection layer is formed;

an optical fiber having a flat light incident end surface on which an antireflection layer is formed and a diffraction grating formed therein; and means for fixing relative positions of said light emitting device and said optical fiber so as to oppose said antireflection layer of said light emitting device to said antireflection layer of said optical fiber.

2. An optical device of claim 1, wherein said light emitting device has a gain region for amplifying a light and a waveguide region for guiding said light, and a thickness of a core layer formed in said waveguide region is changed in a taper fashion.

3. An optical device of claim 2, wherein said light emitting device is a semiconductor laser in which an active layer is put between cladding layers, and said active layer and said core layer are made up of a plurality of MQW layers which are formed continuously.

4. An optical device of claim 1, wherein a reflection layer is formed on an opposite end surface of said light emitting end surface of said light emitting device.

5. An optical device of claim 1, wherein said optical fiber is fitted on a groove which is formed on said fixing means.

6. An optical device of claim 4, wherein said fixing means is made up of a substrate which has a fiber fitting groove on its upper surface.

7. An optical device of claim 1, wherein a temperature control means is provided adjacent to said optical fiber to control a temperature in a desired range.

8. An optical device of claim 7, wherein said temperature control means has a Peltier device.

* * * * *